(12) United States Patent
Moon (10) Patent No.: US 8,139,363 B2
(45) Date of Patent: Mar. 20, 2012

(54) MEMORY CARD AND METHOD OF MANUFACTURING THE SAME

(75) Inventor: Seok-joon Moon, Suwon-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 297 days.

(21) Appl. No.: 12/479,966

(22) Filed: Jun. 8, 2009

(65) Prior Publication Data

US 2009/0323294 A1    Dec. 31, 2009

(51) Int. Cl.
*H05K 1/14* (2006.01)
(52) U.S. Cl. .................. 361/737; 361/736; 361/720
(58) Field of Classification Search .............. 361/737, 361/720, 736, 748, 760
See application file for complete search history.

(56) References Cited

U.S. PATENT DOCUMENTS

| | | | |
|---|---|---|---|
| 6,590,778 B1* | 7/2003 | Hojo et al. | 361/737 |
| 6,922,343 B2 | 7/2005 | Nakanishi et al. | |
| 7,264,992 B2* | 9/2007 | Hsueh et al. | 438/106 |
| 2004/0056104 A1* | 3/2004 | Osawa et al. | 235/492 |

FOREIGN PATENT DOCUMENTS

| | | |
|---|---|---|
| JP | 2001-052135 | 2/2001 |
| JP | 2003-157422 | 5/2003 |
| KR | 20-0389225 | 6/2005 |

* cited by examiner

*Primary Examiner* — Hung S Bui
(74) *Attorney, Agent, or Firm* — Stanzione & Kim, LLP

(57) ABSTRACT

A memory card includes a substrate, at least one semiconductor chip attached to the substrate, a writing permitting/prohibiting setting element attached to the substrate, and a molding member formed on the substrate to cover the semiconductor chip.

21 Claims, 8 Drawing Sheets

MEMORY CARD AND METHOD OF MANUFACTURING THE SAME

CROSS-REFERENCE TO RELATED APPLICATIONS

This application claims priority under 35 U.S.C. §119(a) from Korean Patent Application No. 10-2008-0061109, filed on Jun. 26, 2008, in the Korean Intellectual Property Office, the disclosure of which is incorporated herein in its entirety by reference.

BACKGROUND

1. Field of the Invention

The general inventive concept relates to a memory card and a method of manufacturing the same, and more particularly, to a secure digital (SD) card having a writing permitting/prohibiting setting element and a method of manufacturing the SD card.

2. Description of the Related Art

A memory card, such as a secure digital (SD) card, having a writing permitting/prohibiting setting element is advantageous in that a user can easily set whether or not to permit a write function of the memory card. In general, the memory card having the writing permitting/prohibiting setting element undergoes a housing process in which a semiconductor package having undergone a molding process is enveloped using an upper lid and a lower lid. Also, such a housing process is essential to form the writing permitting/prohibiting setting element.

The detailed description regarding a memory card undergoing the housing process is disclosed in U.S. Pat. No. 6,590,778 (hereinafter, "'778") and U.S. Pat. No. 6,922,343 (hereinafter, "'343").

Figure 1:
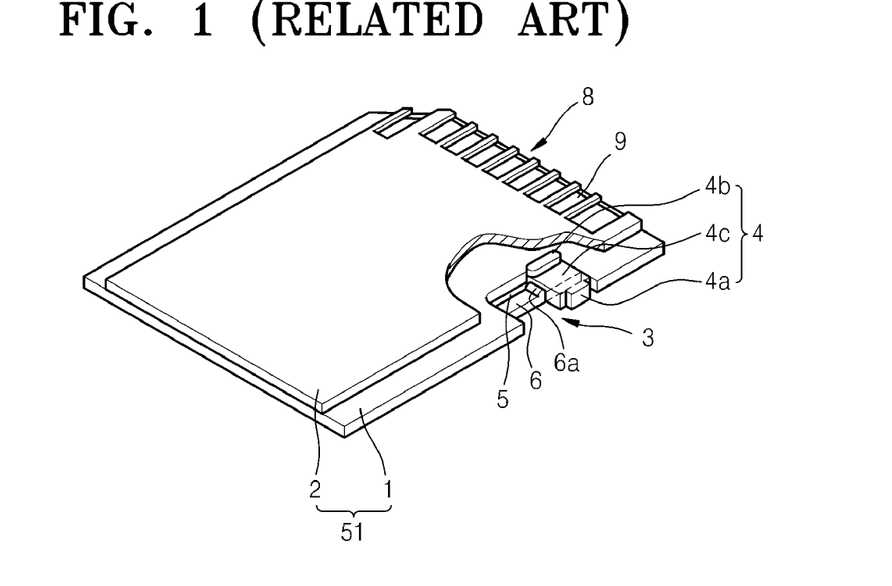
FIG. 1 is a perspective view of a memory card having a writing permitting/prohibiting setting element disclosed in U.S. Pat. No. 6,922,343 as conventional technology.

FIG. 1 is a perspective view of a memory card having a writing permitting/prohibiting setting element 4 disclosed in the '343 patent as conventional technology.

Referring to FIG. 1, a lower lid 2 is partially cut away to show a structure of the writing permitting/prohibiting setting element 4 according to conventional technology. In the conventional technology, a semiconductor package (not illustrated) having undergone a molding process is enveloped by a housing 51 that is formed of an upper lid 1 and the lower lid 2. The writing permitting/prohibiting setting element 4 is comprised of structures 5 and 6 that are formed inside the upper lid 1 and the lower lid 2.

When such a conventional technology is used, the size of the semiconductor package is limited by the size of the housing 51, thereby making it difficult to include a highly integrated memory card. Also, the conventional technology requires a complicated housing process which increases manufacturing costs of memory cards.

SUMMARY

The general inventive concept provides a memory card having a writing permitting/prohibiting setting element, and a method of manufacturing the memory card without undergoing a housing process.

Additional features and/or utilities of the present general inventive concept will be set forth in part in the description which follows and, in part, will be obvious from the description, or may be learned by practice of the general inventive concept.

Embodiments of the present general inventive concept can be achieved by providing a memory card including a substrate, at least one semiconductor chip attached to the substrate, a setting element attached to the substrate, and a molding member formed on the substrate to cover the semiconductor chip. The memory card may be a secure digital (SD) card. The setting element may be spaced apart from the semiconductor chip and may be attached directly to the substrate.

The setting element may include a switch having an insert unit formed at an end of the switch and a switch guide unit having a slot formed in a surface of the switch guide unit whereby the insert unit may be inserted into the slot. The switch guide unit may have a structure in which opposite ends of the slot are closed to an external environment. The molding member may encapsulate the switch guide unit to expose the slot to an environment outside of the memory card.

The slot may extend in a longitudinal direction of the switch guide unit, whereby the insert unit may be inserted into and slid in the slot. The insert unit may have a cross-sectional shape, and the slot may have a cross-sectional shape to correspond with the cross-sectional shape of the insert unit. The molding member may encapsulate the switch guide unit in such a manner that the switch may be inserted into and slid in the slot of the switch guide unit. The molding member may encapsulate the switch guide unit and opposite ends of the slot in such a manner that the switch can be inserted into and slid in the slot of the switch guide unit.

The switch guide unit may be formed of a material capable of withstanding a temperature and pressure of a process in which the molding member is formed. The insert unit may have a T-shaped cross-sectional shape, the slot may have a cross-sectional shape capable of accepting the insert unit having the T-shaped cross-sectional shape, and the insert unit may be formed of an elastic material whereby the insert unit can be inserted into the slot.

The substrate may include a printed circuit board (PCB), and the molding member may include an epoxy molding compound (EMC).

Embodiments of the present general inventive concept can also be achieved by providing a method of manufacturing a memory card, the method including arranging a substrate, attaching at least one semiconductor chip to the substrate, attaching a switch guide unit having a slot to the substrate, wherein the slot is formed in an end surface of the switch guide unit and a portion of a switch inserts into the slot, encapsulating the at least one semiconductor chip and the switch guide unit on the substrate by using a molding member, and inserting the portion of the switch into the slot, thereby assembling a writing permitting/prohibiting setting element, wherein the encapsulating the at least one semiconductor chip includes encapsulating the switch guide unit by using the molding member, thereby exposing the slot to an environment outside of the memory card.

Embodiments of the present general inventive concept can also be achieved by providing a method of manufacturing a memory card, the method including arranging a substrate, attaching at least one semiconductor chip to the substrate, inserting a portion of a switch into a slot formed in a surface of a switch guide unit, thereby assembling a writing permitting/prohibiting setting element, attaching the writing permitting/prohibiting setting element to the substrate, and encapsulating the semiconductor chip and the switch guide unit on the substrate by using a molding member.

Embodiments of the present general inventive concept can also be achieved by providing a method of manufacturing a memory card, the method including disposing a switch unit having an insert unit movable between first and second positions on a substrate having thereon at least one semiconductor chip and disposing a molding member on the substrate to cover the at least one semiconductor chip and to secure the switch unit to the substrate, wherein the first position of the switch unit corresponds to a first state to permit writing of data on the memory card and the second position of the switch unit corresponds to a second state to prohibit writing of data on the memory card.

The method may further include forming a slot in a switch guide unit of the switch unit to correspond with a shape of the insert unit such that the insert unit may be movable between the first and second positions.

Embodiments of the present general inventive concept can also be achieved by providing a memory card which includes a substrate, a setting element having a switch disposed on the substrate, the switch to permit writing in a first position and prohibit writing in a second position, and a molding member disposed to cover the substrate and to secure the setting element to the substrate.

The first position may correspond to a first state wherein the memory card allows data to be written thereon and the second position may correspond to a second state wherein the memory card prohibits data to be written thereon.

The setting element may further include an insert unit and a switch guide unit, the insert unit may be slidable within the switch guide unit to be movable between the first and second positions.

The switch guide unit may include a slot which has a cross-section corresponding to a cross-section of the insert unit.

The cross section of the switch guide unit may be larger than the cross-section of the insert unit.

The insert unit may have at least one of a T-shape, a Y-shape, and a frustocone shape to be insertable within the slot of the switch guide unit.

The memory card may further include at least one semiconductor chip disposed on the substrate.

The setting element may be spaced apart from the at least one semiconductor chip.

The setting element unit may be disposed directly on the substrate.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

The present general inventive concept will now be described more fully with reference to the accompanying drawings, in which exemplary embodiments of the inventive concept are illustrated. The present general inventive concept may, however, be embodied in many different forms, and should not be construed as being limited to the exemplary embodiments set forth herein; rather, these exemplary embodiments are provided so that this disclosure will be thorough and complete, and will fully convey the general inventive concept to one skilled in the art.

Reference will now be made in detail to the exemplary embodiments of the present general inventive concept, examples of which are illustrated in the accompanying drawings, wherein like reference numerals refer to the like elements throughout. The exemplary embodiments are described below in order to explain the present general inventive concept by referring to the figures.

In the drawings, a thicknesses of layers and regions may be exaggerated for clarity. Like reference numerals denote like elements throughout the specification. Throughout the specification, it will also be understood that when an element such as layer, region, or substrate is referred to as being "on" another element, it can be directly "on" the other element, or intervening elements may also be present.

Figure 2:
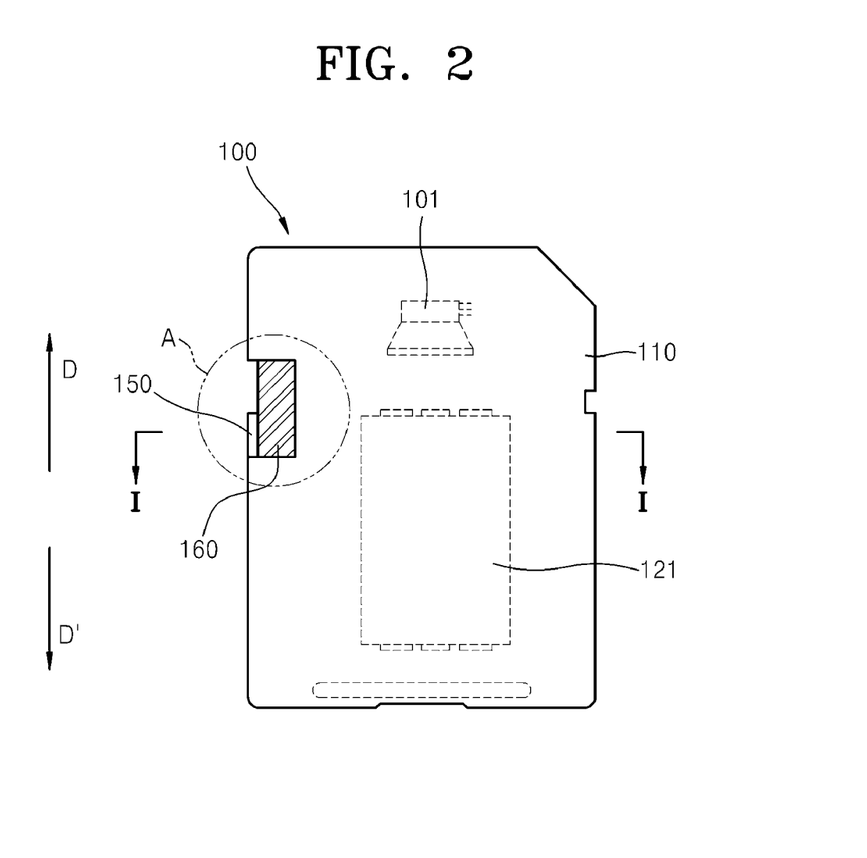
FIG. 2 is a top plan view illustrating a memory card according to an exemplary embodiment of the present general inventive concept.
Figure 3:
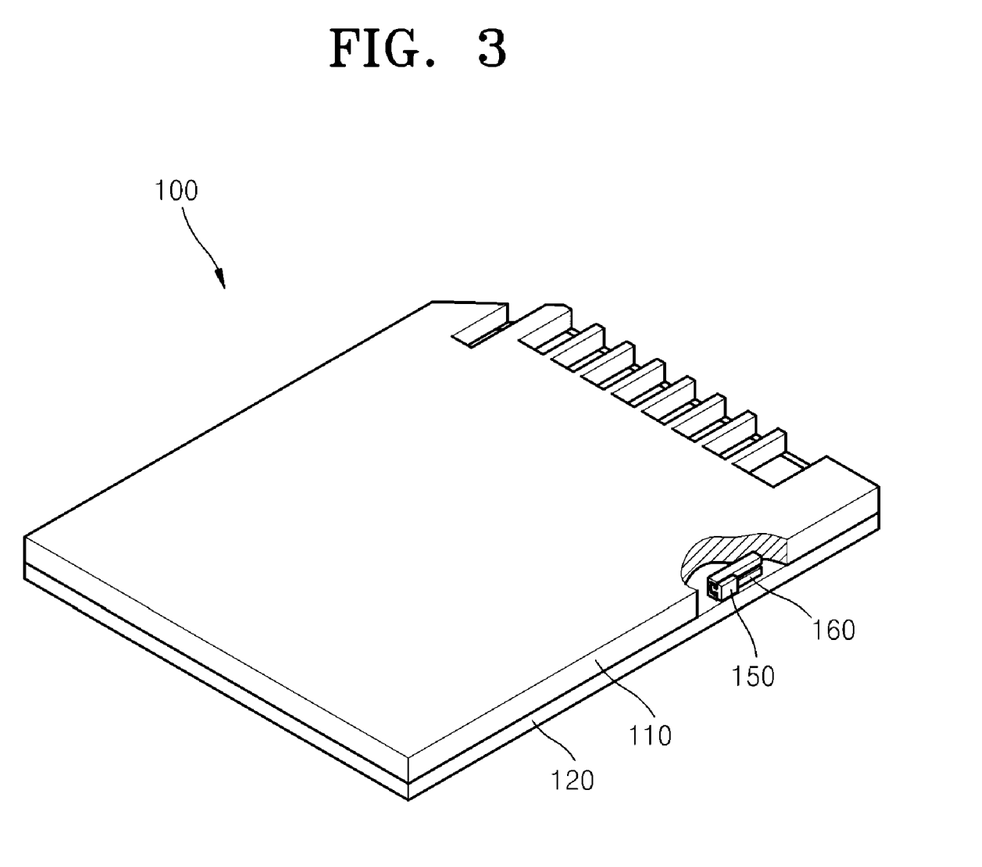
FIG. 3 is a partial sectional perspective view illustrating the memory card according to the exemplary embodiment of FIG. 2.

FIG. 2 is a top plan view illustrating a memory card 100 according to an exemplary embodiment of the present general inventive concept. FIG. 3 is a perspective view illustrating the memory card 100 according to the exemplary embodiment of FIG. 2.

Referring to FIGS. 2 and 3, at least one semiconductor chip 121 may be attached on a substrate 120. A controller 101 and various other passive elements or devices (not illustrated) may be further formed on the substrate 120, as well as the semiconductor chip 121. The memory card 100 according to the present exemplary embodiment of the present general inventive concept may be a secure digital (SD) card. However, the present general inventive concept is not limited thereto.

In exemplary embodiments, a writing permitting/prohibiting setting element may be formed on the substrate 120 to be spaced apart from the semiconductor chip 121. The writing permitting/prohibiting setting element may be formed of a switch 150 and a switch guide unit 160. The switch guide unit 160, which is apart from the semiconductor chip 121, may be attached on the substrate 120. Here, a term "attached on" means that the substrate 120 and the switch guide unit 160 are coupled to each other by using a molecular bonding and without using a mediating object therebetween, or the substrate 120 and the switch guide unit 160 may be coupled to each other by using a bonding layer therebetween. However, the present general inventive concept is not limited thereto. That is, in alternative exemplary embodiments, various other layers may also be disposed between the switch guide unit 160 and the substrate 120, such as an insulation layer (not illustrated).

A molding member 110, which encapsulates the semiconductor chip 121 and the switch guide unit 160 disposed on the substrate 120, may be formed on the substrate 120. In FIG. 3, the molding member 110 is partially cut away to illustrate a structure of the writing permitting/prohibiting setting element disposed at an edge of the memory card 100. However, the present general inventive concept is not limited thereto. That is, in alternative exemplary embodiments, the writing permitting/prohibiting setting element may be disposed at various other locations of the substrate 120.

The molding member 110 encapsulates the switch guide unit 160 so that the switch 150 may be inserted and slid in a slot S (i.e., moved in an upward direction D and in a downward direction D' in FIG. 2) of the switch guide unit 160. However, the present general inventive concept is not limited thereto. That is, the switch guide 160 may be formed within the molding member 110 such that the switch 150 may be inserted within a slot S and moved from a first position to a second position different than the first position. In exemplary embodiments, the first position corresponds to a setting of the memory card 100 which permits writing thereon and the second position corresponds to a setting of the memory card 100 which prohibits writing, such as data, thereon.

The substrate 120 may be a printed circuit board (PCB), and the molding member 110 may be an epoxy molding compound (EMC). However, the present general inventive concept is not limited thereto.

A detailed structure of the writing permitting/prohibiting setting element, which includes the switch 150 and the switch guide unit 160, will now be described with reference to FIGS. 4A through 5B.

Figure 4A:
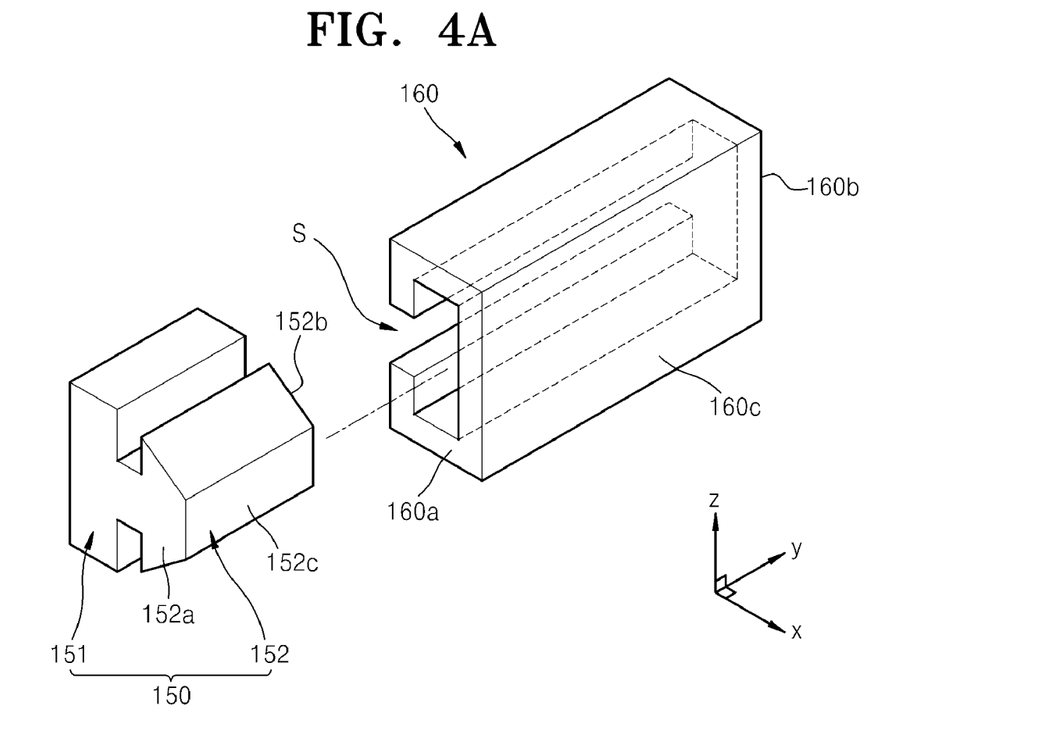
FIGS. 4A and 5A are respectively a perspective view and a cross-sectional view both illustrating a structure of a writing permitting/prohibiting setting element before a switch is inserted in a switch guide unit.
Figure 4B:
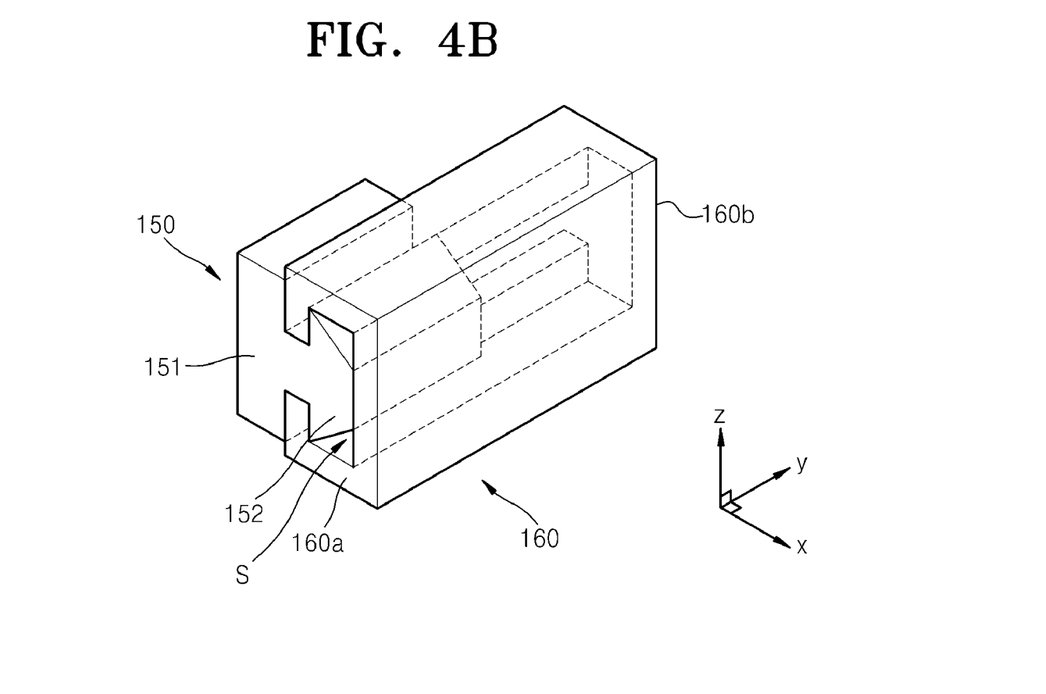
FIGS. 4B and 5B are respectively a perspective view and a cross-sectional view both illustrating a structure of the writing permitting/prohibiting setting element after the switch is inserted in the switch guide unit.
Figure 5A:
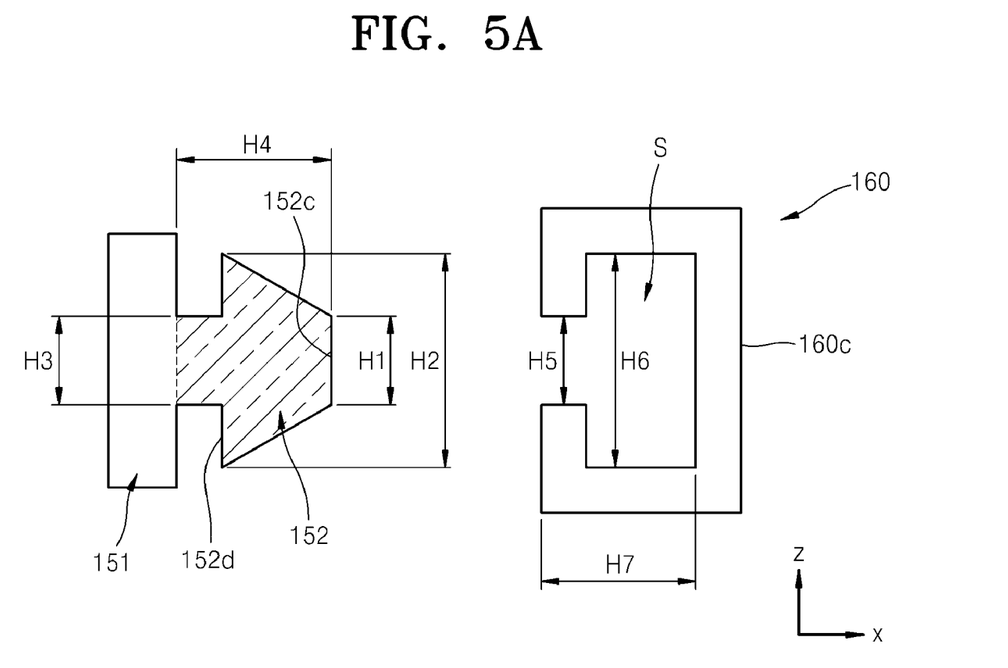
Figure 5B:
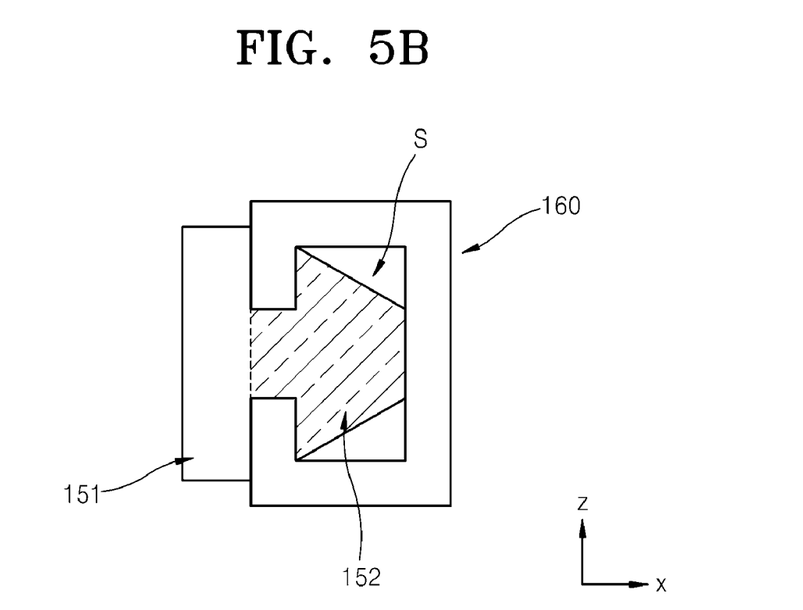

FIGS. 4A and 5A are respectively a perspective view and a cross-sectional view both illustrating a structure of a writing permitting/prohibiting setting element before a switch 150 is inserted in a switch guide unit 160. FIGS. 4B and 5B are respectively a perspective view and a cross-sectional view both illustrating a structure of the writing permitting/prohibiting setting element after the switch 150 is inserted in the switch guide unit 160.

Referring to FIGS. 4A through 5B, the switch 150 may include an insert unit 152 formed at one end thereof, and a handling unit 151 formed at an opposite end thereof. The insert unit 152 corresponds to a portion of the switch 150 formed by oblique sides in FIG. 5A. The switch guide unit 160 has a slot S formed through first and second ends 160a and 160b of the switch guide unit 160, so that the insert unit 152 may be inserted into the slot S. However, the present general inventive concept is not limited thereto. That is, in alternative exemplary embodiments, the insert unit 152 may be formed is various other sizes and shapes to correspond to a size and shape of the slot S. In exemplary embodiments, the slot S extends in a longitudinal direction (i.e., in a Y-axis direction) so that the switch 150 may be inserted into the slot S of the switch guide unit 160 and be slid back and forth (i.e., in the Y-axis direction) in the slot S of the switch guide unit 160. However, the present general inventive concept is not limited thereto. That is, in alternative exemplary embodiments, the slot S may extend in various other directions, so that the switch 150 may be slid between the first position and the second position.

Referring to FIG. 4A, according to the present exemplary embodiment of the present general inventive concept, the switch guide unit 160 may have a structure in which opposite ends of the slot S are opened to an external environment. In this case, the insert unit 152 may extend in a lengthwise direction (i.e, in the Y-axis direction) in the slot S so that the writing permitting/prohibiting setting element may be assembled. A cross-sectional shape of the insert unit 152 may be the same or substantially similar to that of the slot S. In exemplary embodiments, the cross-sectional shape of the insert unit 152 and the cross-sectional shape of the slot S may be "T-shaped." However, the present general inventive concept is not limited thereto. That is, in alternative exemplary embodiments, the insert unit 152 may have a cross-section corresponding to a cross-section of the switch guide unit 160. In alternative exemplary embodiments, a cross-sectional area of the insert unit 152 may be equal to or less than a cross-sectional area defining the slot S. Meanwhile, a molding member 110 (see FIGS. 2 and 3) encloses and fixes the switch guide unit 160 on a substrate 120, and opposite ends of the slot S may be encapsulated by the molding member 110 to thereby set a limit to the sliding of the switch 150 along the slot S of the switch guide unit 160. The molding member 110 may encapsulate the switch guide unit 160, thereby exposing the slot S to an environment outside of the memory card 100. Meanwhile, in exemplary embodiments, the switch guide unit 160 may be formed of a material capable of withstanding a temperature and pressure of a process in which the molding member 110 is formed.

However, according to another exemplary embodiment of the present general inventive concept, the switch guide unit 160 may have a structure in which opposite ends of the slot S are closed to an external environment. That is, in exemplary embodiments, the switch guide unit 160 may have a structure in which first and second ends 160a and 160b of the switch guide unit 160, as illustrated in FIG. 4A, are not opened to the external environment on a ZX coordinate plane. In this case, the insert unit 152 may not be inserted in a lengthwise direction (i.e., in the Y axis-direction) in the slot S but may be inserted in the slot S in an X-axis direction so that the writing permitting/prohibiting setting element may be assembled. In exemplary embodiments, a cross-sectional shape of the insert unit 152 and a cross-sectional shape of the slot S may be "T-shaped." However, the present general inventive concept is not limited thereto.

Figure 8A:
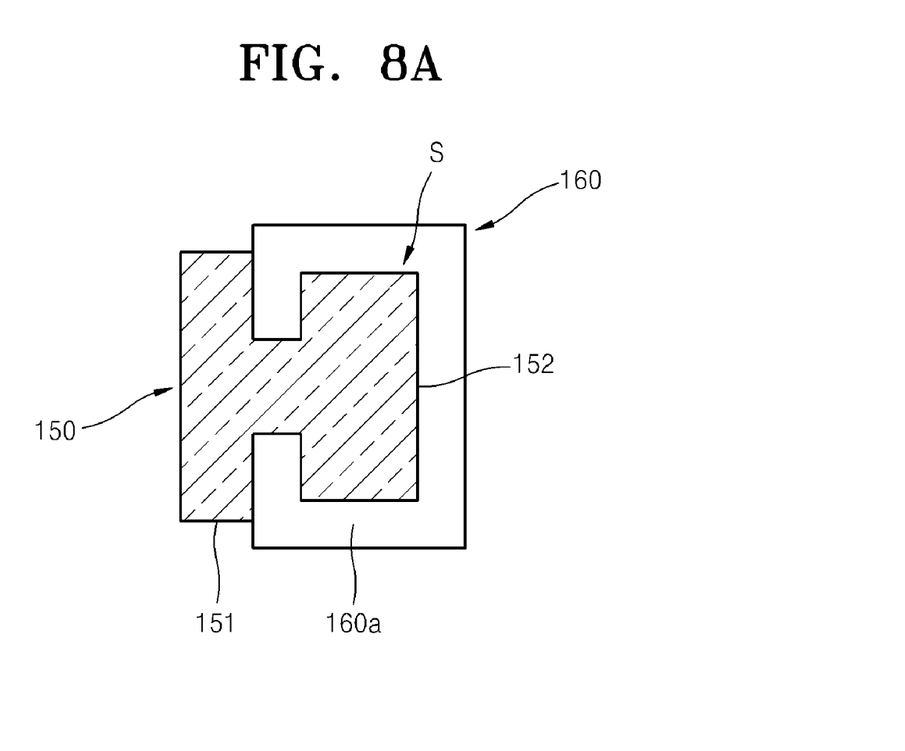
FIGS. 8A through 8C are cross-sectional views illustrating a switch and a switch guide unit according to exemplary embodiments of the present general inventive concept.
Figure 8B:
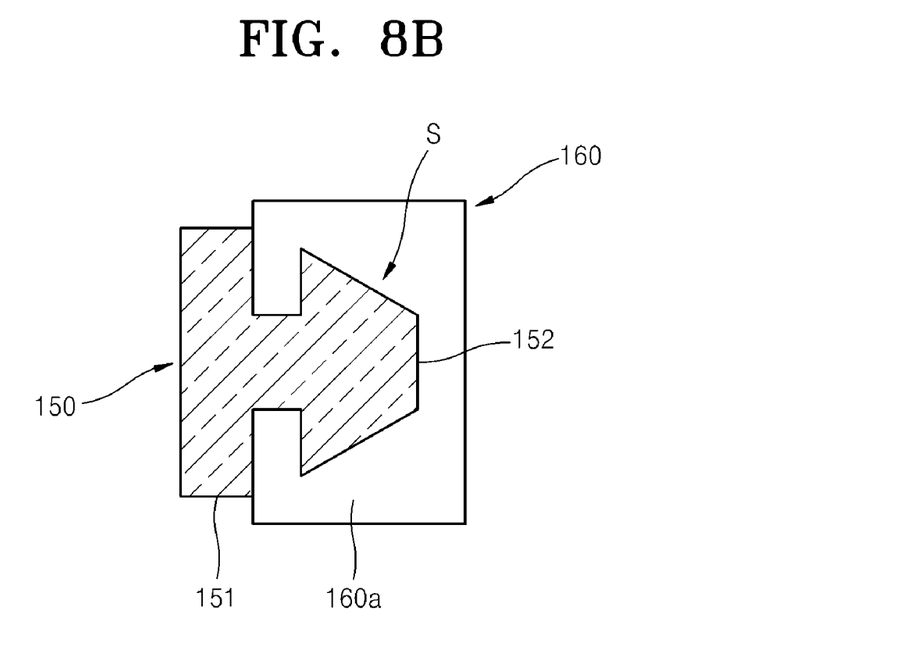
Figure 8C:
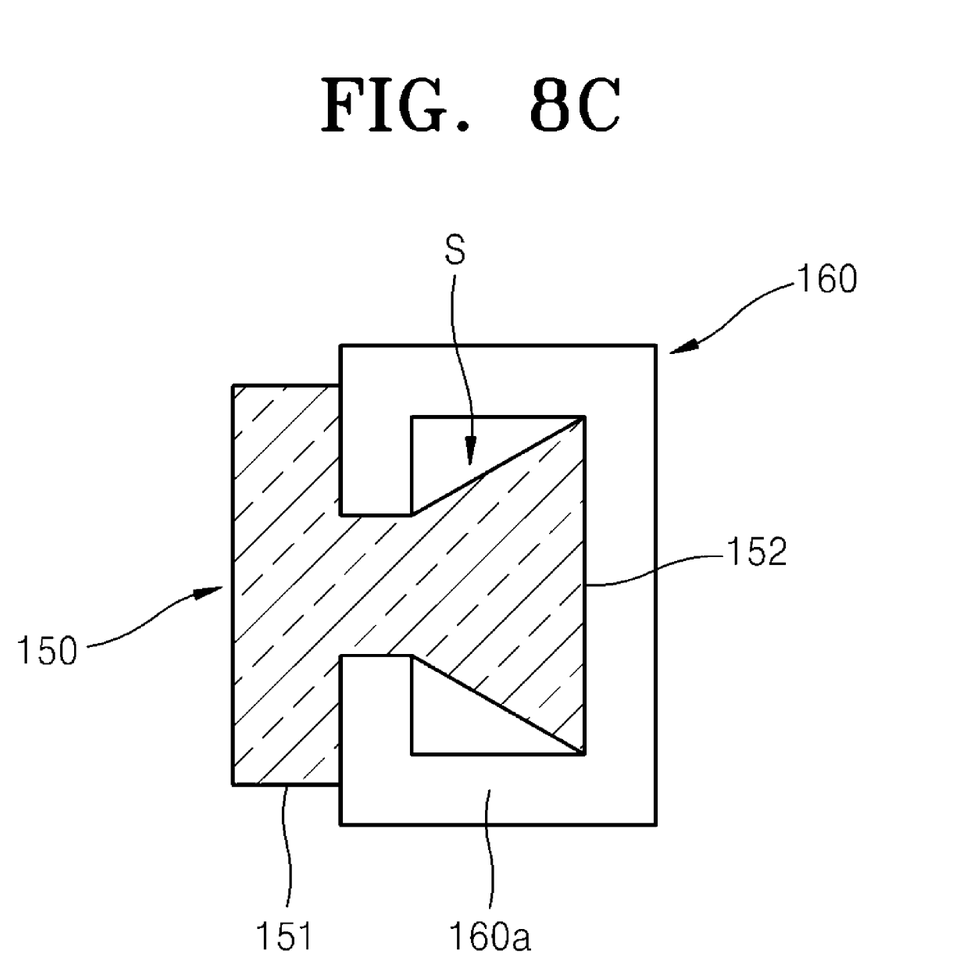

FIGS. 8A through 8C are cross-sectional views illustrating exemplary embodiments of a writing permitting/prohibiting setting element after a switch 150 is inserted in a switch guide unit 160.

Referring now to FIG. 8A, a cross-sectional shape of the insert unit 152 and a cross-sectional shape of the slot S may be "T-shaped. In alternative exemplary embodiments, the cross-sectional shapes of the insert unit 152 and the slot S may be frustocone shaped. However, the present general inventive concept is not limited thereto. That is, in exemplary embodiments, the cross-section of the insert unit 152 may be cone shaped and the cross-section of an area defining the slot S may be "T-shaped."

However, in order for the insert unit 152 to easily insert into the slot S in the X-axis direction, a width H1 of a first end 152c of the insert unit 152 may be less than a width H2 of a second end 152d of the insert unit 152. The width H2 of the second end 152d may be less than or equal to a width H5 of the switch guide unit 160. Furthermore, in exemplary embodiments, a width H3 of the switch 150 may correspond to a width H5 of the switch guide unit 160. In further exemplary embodiments, the width H2 of the switch 150 may correspond to a width H6 of the switch guide unit 160. In addition, in alternative exemplary embodiments, a width H4 of the switch 150 may correspond with a width H7 of the switch guide unit 160. In exemplary embodiments, the insert unit 152 may be formed of an elastic material so that the insert unit 152 may be inserted into the slot S.

Figure 6A:
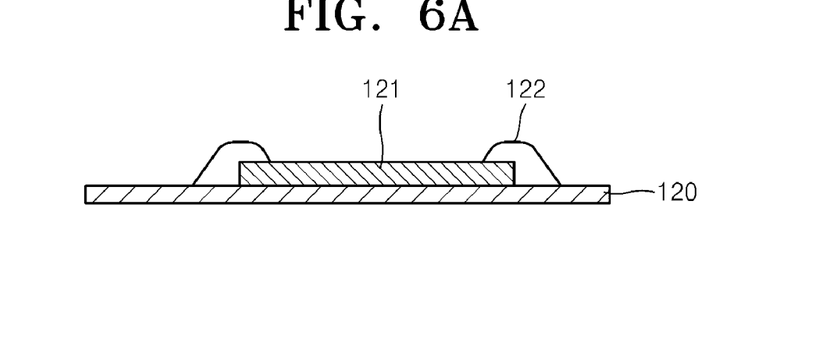
FIGS. 6A through 6C are cross-sectional views illustrating a method of manufacturing the memory card, according to an exemplary embodiment of the present general inventive concept.
Figure 6B:
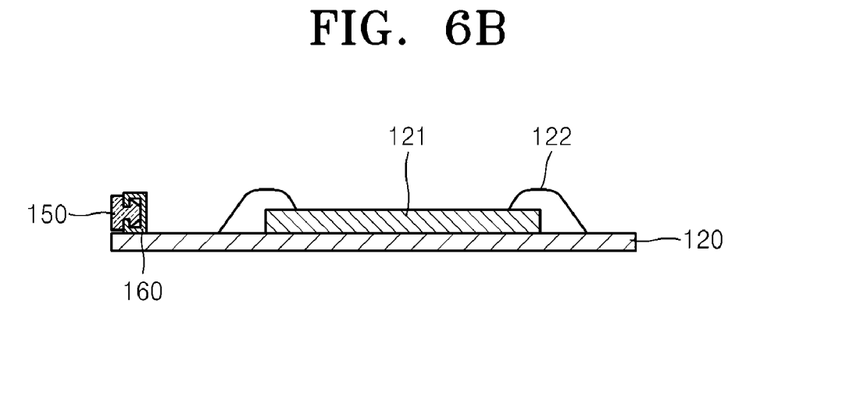
Figure 6C:
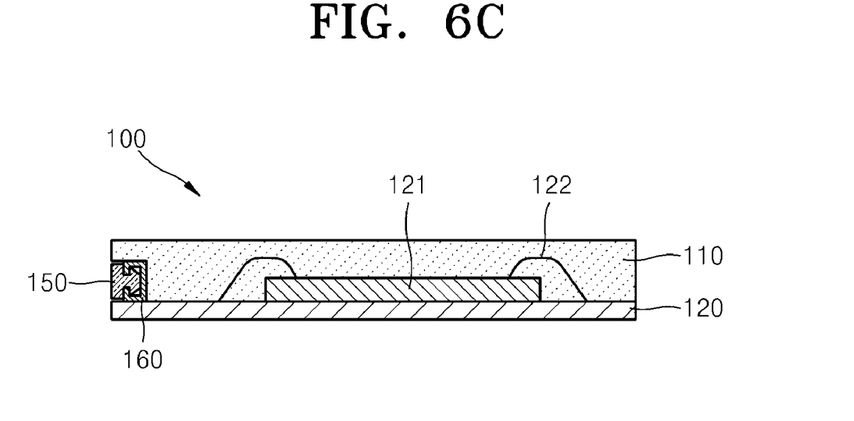

FIGS. 6A through 6C are cross-sectional views illustrating a method of manufacturing the memory card 100, according to an exemplary embodiment of the present general inventive concept.

Referring to FIG. 6A, a semiconductor chip 121 may be arranged and attached on a substrate 120. In exemplary embodiments, the substrate 120 and the semiconductor chip 121 may be electrically connected to each other with bonding wires 122. However, the present general inventive concept is not limited thereto. That is, in alternative exemplary embodiments, the semiconductor chip 121 may be in electrical communication with the substrate 120 via various other methods, such as via an electrical pad.

Referring to FIG. 6B, a portion of a switch 150 may be inserted into a slot S formed through the first and second end surfaces 160a and 160b of a switch guide unit 160 so that a writing permitting/prohibiting setting element is assembled. The assembled writing permitting/prohibiting setting element may be attached on the substrate 120. Also, the writing permitting/prohibiting setting element may be disposed at an end of the substrate 120 and spaced apart from the semiconductor chip 121. However, the present general inventive concept is not limited thereto.

As described above with reference to FIGS. 4A through 5B, the switch guide unit 160 may have a structure in which opposite ends of the slot S are closed to an external environment. In this case, a method of inserting the insert unit 152 into the slot S has already been described, thus, a description thereof will be omitted here.

Referring to FIG. 6C, the semiconductor chip 121 and the switch guide unit 160 disposed on the substrate 120 may be encapsulated with a molding member 110 so that the assembly of the memory card 100 may be completed.

As described above with reference to FIGS. 4A through 5B, in the case where the switch guide unit 160 includes a structure in which opposite ends of the slot S are opened to the external environment, the molding member 110 may also encapsulate the opposite ends of the slot S.

Figure 7A:
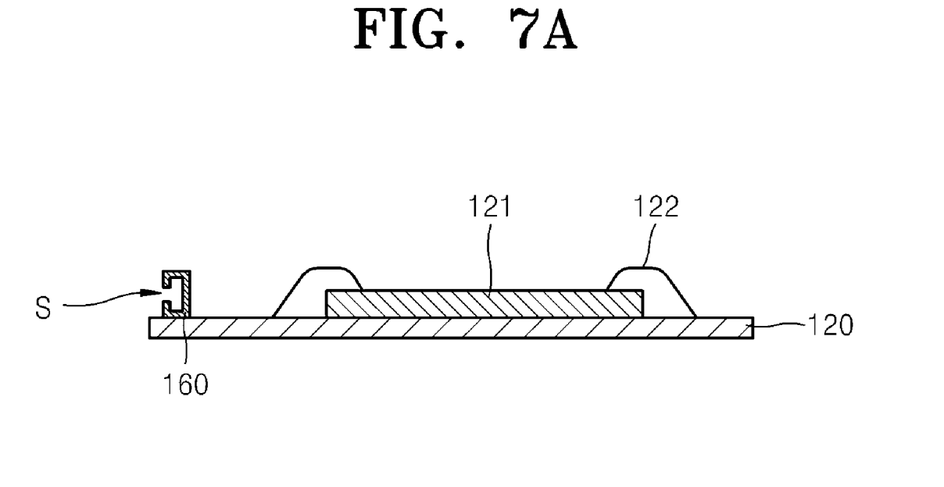
FIGS. 7A and 7B are cross-sectional views illustrating a method of manufacturing the memory card, according to another exemplary embodiment of the present general inventive concept.
Figure 7B:
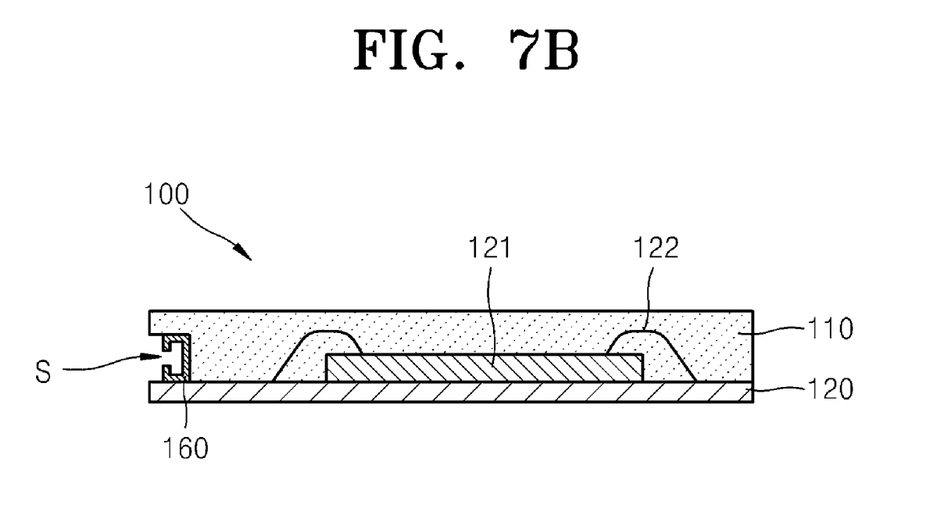

FIGS. 7A and 7B are cross-sectional views illustrating a method of manufacturing the memory card 100, according to another exemplary embodiment of the present general inventive concept.

Likewise in the previous exemplary embodiment described with reference to FIG. 6A, a substrate 120 and a semiconductor chip 121 may be arranged and/or attached on the substrate 120.

Referring to FIG. 7A, a switch guide unit 160 may be attached on the substrate 120. The switch guide unit 160 may be disposed on the substrate 120 in such a manner that an end surface of the switch guide unit 160 may be exposed to an external environment of the memory card 100, wherein a slot S to which a portion of a switch 150 may be inserted into is formed on the end surface.

Referring now to FIG. 7B, a molding member 110 may encapsulate the semiconductor chip 121 and the switch guide unit 160 on the substrate 120. At this time, the molding member 110 may not encapsulate the end surface of the switch guide unit 160 in which the slot S is formed.

FIGS. 8A through 8C are cross-sectional views illustrating a switch and a switch guide unit according to exemplary embodiments of the present general inventive concept.

Referring to FIGS. 8A and 8B, in exemplary embodiments, a cross-section of the insert unit 152 may correspond to a cross-section defining a slot S of the switch guide unit 160. However, the present general inventive concept is not limited thereto. That is, in alternative exemplary embodiments, a portion of a cross-section of the insert unit 152 may correspond to a portion of the switch guide unit 160.

As described above with reference to FIGS. 4A through 5B, in the case where the switch guide unit 160 includes a structure in which both side ends of the slot S are opened, the molding member 110 may also encapsulate the both side ends of the slot S.

In exemplary embodiments, an insert unit 152 of the switch 150 may be inserted into the slot S to assemble a writing permitting/prohibiting setting element, so that the assembly of the memory card 100 (see FIG. 6C) is completed. As described above with reference to FIGS. 4A through 5B, the insert unit 152 may not be inserted in a lengthwise direction (i.e., in the Y-axis direction illustrated in FIGS. 4A and 4B) in the slot S, but may be inserted in the slot S in the X-axis direction, so that the writing permitting/prohibiting setting element may be assembled. This has been described above with reference to FIGS. 4A through 5B, and thus, a description thereof will be omitted here.

According to the present general inventive concept, manufacturing costs associated with the memory cards may be reduced since a housing process is no longer required, and a more highly integrated memory card may be embodied, since additional space corresponding to a size of a housing has been gained.

Although several embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A memory card comprising:
   a substrate;
   at least one semiconductor chip attached to the substrate;
   a writing permitting/prohibiting setting element including a switch guide unit attached to the substrate and a switch coupled to the switch guide unit; and
   a molding member molded on the substrate to cover the semiconductor chip and to cover the switch and the switch guide unit of the writing permitting/prohibiting setting element.

2. The memory card of claim 1, wherein the memory card is a secure digital card.

3. The memory card of claim 1, wherein the writing permitting/prohibiting setting element is spaced apart from the semiconductor chip and is attached directly to the substrate.

4. The memory card of claim 1, wherein the writing permitting/prohibiting setting element comprises:
   the switch having a top and a bottom and a face extending between the top and the bottom at a first end and an insert unit formed at a second end of the switch; and
   a switch guide unit having a slot formed in a surface of the switch guide unit whereby the insert unit inserts into the slot.

5. The memory card of claim 4, wherein the molding member encapsulates the switch guide unit such that the face is flush with an outer edge of the substrate and an outer edge of the molding member, thereby exposing the slot to an environment outside of the memory card.

6. The memory card of claim 4, wherein the slot extends in a longitudinal direction of the switch guide unit, whereby the insert unit inserts into and slides in the slot.

7. The memory card of claim 6, wherein the insert unit has a cross-sectional shape, and the slot has a cross-sectional shape to correspond with the cross-sectional shape of the insert unit.

8. The memory card of claim 7, wherein the molding member encapsulates the switch guide unit in such a manner that the switch can insert into and slide in the slot of the switch guide unit.

9. The memory card of claim 7, wherein the molding member encapsulates the switch guide unit and opposite ends of the slot in such a manner that the switch can insert into and slide in the slot of the switch guide unit.

10. The memory card of claim 4, wherein the switch guide unit has a structure in which opposite ends of the slot are closed to an external environment.

11. The memory card of claim 4, wherein the switch guide unit is formed of a material capable of withstanding a temperature and pressure of a process in which the molding member is formed.

12. The memory card of claim 4, wherein the insert unit has a T-shaped cross-sectional shape, the slot has a cross-sectional shape capable of accepting the insert unit having the T-shaped cross-sectional shape, and the insert unit is formed of an elastic material, whereby the insert unit is insertable into the slot.

13. The memory card of claim 1, wherein the substrate comprises a printed circuit board.

14. A memory card comprising:
 a substrate;
 a setting element having a switch guide unit disposed on the substrate and a moveably coupled to the switch guide unit, the switch to permit writing in a first position and prohibit writing in a second position; and
 a molding member molded on the substrate to cover the substrate and to cover of the switch and the switch guide unit of the setting element to secure the setting element to the substrate.

15. The memory card of claim 14, wherein the first position corresponds to a first state wherein the memory card allows data to be written thereon and the second position corresponds to a second state wherein the memory card prohibits data to be written thereon.

16. The memory card of claim 14, wherein the setting element further includes an insert unit and a switch guide unit, the insert unit slidable within the switch guide unit to be movable between the first and second positions.

17. The memory card of claim 16, wherein the switch guide unit includes a slot which has a cross-section corresponding to a cross-section of the insert unit.

18. The memory card of claim 17, wherein the cross section of the switch guide unit is larger than the cross-section of the insert unit.

19. The memory card of claim 17, wherein the insert unit has at least one of a T-shape, a Y-shape, and a frustocone shape to be insertable within the slot of the switch guide unit.

20. The memory card of claim 14, wherein the setting element is disposed directly on the substrate.

21. A housing of a memory card having a substrate and at least one semiconductor chip coupled to the substrate, comprising:
 a writing permitting/prohibiting setting element including a switch guide unit disposed on a single surface of the substrate and a switch coupled to the switch guide unit; and
 a molding member molded on the single surface to cover the semiconductor chip and to cover the switch and the switch guide unit to secure the writing permitting/prohibiting setting element to the substrate.

* * * * *

UNITED STATES PATENT AND TRADEMARK OFFICE
CERTIFICATE OF CORRECTION

| | | |
|---|---|---|
| PATENT NO. | : 8,139,363 B2 | Page 1 of 1 |
| APPLICATION NO. | : 12/479966 | |
| DATED | : March 20, 2012 | |
| INVENTOR(S) | : Seok-joon Moon | |

It is certified that error appears in the above-identified patent and that said Letters Patent is hereby corrected as shown below:

On the Title Page add:

Item (30) Foreign Application Priority Data
June 26, 2008 (KR)....10-2008-0061109

Signed and Sealed this
Seventeenth Day of July, 2012

David J. Kappos
*Director of the United States Patent and Trademark Office*